US009799593B1

(12) United States Patent
Bryks et al.

(10) Patent No.: US 9,799,593 B1
(45) Date of Patent: Oct. 24, 2017

(54) SEMICONDUCTOR PACKAGE SUBSTRATE HAVING AN INTERFACIAL LAYER

(71) Applicant: Intel Corporation, Santa Clara, CA (US)

(72) Inventors: Whitney Michael Bryks, San Diego, CA (US); Bainye Francoise Angoua, Phoenix, AZ (US); Dilan Anuradha Seneviratne, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/089,026

(22) Filed: Apr. 1, 2016

(51) Int. Cl.
*H05K 1/02* (2006.01)
*H05K 1/09* (2006.01)
*H05K 1/00* (2006.01)
*H01L 23/498* (2006.01)
*H01L 21/48* (2006.01)
*H05K 3/46* (2006.01)
*H05K 3/18* (2006.01)

(52) U.S. Cl.
CPC .... *H01L 23/49838* (2013.01); *H01L 21/4857* (2013.01); *H01L 23/49822* (2013.01); *H01L 23/49894* (2013.01); *H05K 1/02* (2013.01); *H05K 3/18* (2013.01); *H05K 3/4661* (2013.01)

(58) Field of Classification Search
CPC ........... H05K 1/02; H05K 3/4661; H05K 3/18
USPC ........................................................ 174/259
See application file for complete search history.

(56) References Cited

U.S. PATENT DOCUMENTS

| 5,391,397 | A | * | 2/1995 | Mukerji | C08J 7/12 257/E21.503 |
| 6,455,443 | B1 | * | 9/2002 | Eckert | H01L 21/02126 257/E21.259 |
| 8,089,299 | B1 | * | 1/2012 | Rahman | H03K 19/17736 257/208 |
| 2009/0056991 | A1 | | 3/2009 | Kuhr et al. | |
| 2009/0056994 | A1 | | 3/2009 | Kuhr et al. | |
| 2009/0304914 | A1 | * | 12/2009 | Nalla | C23C 16/18 427/124 |
| 2011/0088933 | A1 | * | 4/2011 | Amou | H05K 3/385 174/257 |
| 2012/0125514 | A1 | | 5/2012 | Wei et al. | |
| 2013/0171447 | A1 | * | 7/2013 | Kim | H01L 31/048 428/336 |
| 2014/0255709 | A1 | | 9/2014 | Hasegawa et al. | |
| 2014/0295589 | A1 | * | 10/2014 | Lindberg | H01L 33/44 438/22 |
| 2015/0104657 | A1 | | 4/2015 | Fukunaga et al. | |

OTHER PUBLICATIONS

PCT International Search Report and Written Opinion for PCT International Appln No. PCT/US2017/017241 dated May 19, 2017. (13 pages).

* cited by examiner

*Primary Examiner* — Sherman Ng
(74) *Attorney, Agent, or Firm* — Schwabe, Williamson & Wyatt P.C

(57) ABSTRACT

Semiconductor package substrates and methods of forming semiconductor package substrates are described. In an example, a semiconductor package substrate includes an interfacial layer between a metal layer and a dielectric layer. For example, the interfacial layer may be attached to the metal layer and the dielectric layer by a chemical bond, e.g., a coordinate bond or a covalent bond. Accordingly, the metal layer may adhere to the dielectric layer.

20 Claims, 10 Drawing Sheets

DETAIL C

A - A

DETAIL A

DETAIL B

DETAIL C

SEMICONDUCTOR PACKAGE SUBSTRATE HAVING AN INTERFACIAL LAYER

TECHNICAL FIELD

Embodiments of the invention are in the field of semiconductor packages and, in particular, semiconductor package substrates and methods of forming semiconductor package substrates.

BACKGROUND

Semiconductor package substrates typically function as intermediate structures between an integrated circuit and a device substrate, e.g., a printed circuit board. A semiconductor package substrate supports the integrated circuit and transmits electrical signals between the integrated circuit and the device substrate through various conductors, e.g., conductive traces or vias. The semiconductor package substrate may include alternating layers of conductive and insulating layers, and the conductive layers are generally patterned to form the conductors. The layers of the semiconductor package substrate are typically deposited and/or laminated on one another.

A surface preparation process known as a "desmear" process may be used to roughen an insulating layer prior to depositing a conductive layer on the insulating layer. The roughened surface of the insulating layer is intended to enhance adhesion between the conductive and insulating layers. More particularly, the surface preparation is intended to promote mechanical adhesion by creating a rough surface such that the conductive layer anchors to the insulating layer. Thus, the desmear process is usually tuned to maximize mechanical adhesion.

DESCRIPTION OF EMBODIMENTS

Semiconductor package substrates including an interfacial layer between a metal layer and a dielectric layer are described. In the following description, numerous specific details are set forth, such as packaging and interconnect architectures, in order to provide a thorough understanding of embodiments of the present invention. It will be apparent to one skilled in the art that embodiments of the present invention may be practiced without these specific details. In other instances, well-known features, such as specific semiconductor fabrication processes, are not described in detail in order to not unnecessarily obscure embodiments of the present invention. Furthermore, it is to be understood that the various embodiments shown in the Figures are illustrative representations and are not necessarily drawn to scale.

Figure 1:
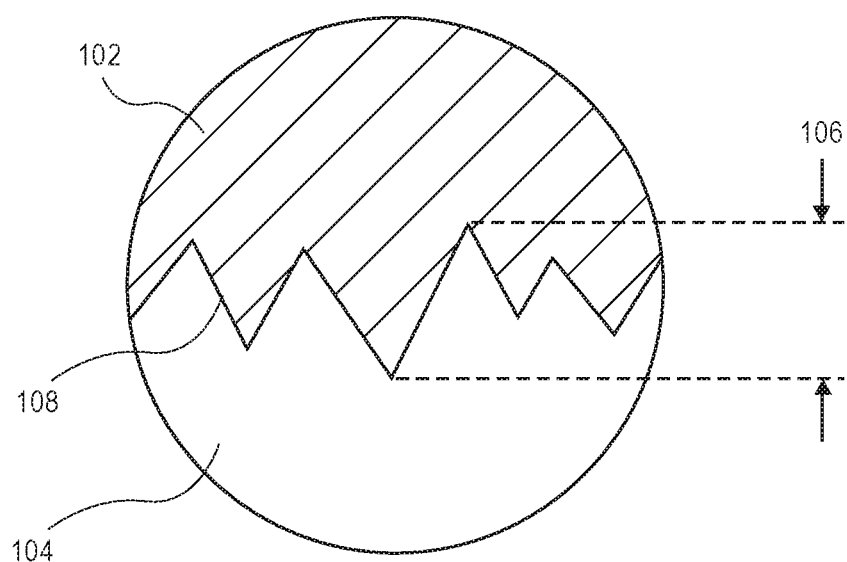
FIG. 1 illustrates an interface between a copper layer and a dielectric film of a semiconductor package substrate.

Referring to FIG. 1, an interface between a copper layer and a dielectric film of a semiconductor package substrate is shown. A copper layer 102 may anchor to a dielectric film 104 having a roughened surface. For example, dielectric film 104 may be roughened by a desmear process. The desmear process involves swelling dielectric layer using a solvent chemistry and applying a highly oxidizing chemistry, e.g., a sodium permanganate chemistry, to break material bonds at a surface of dielectric film 104. The broken material bonds manifest as the roughened surface shown.

Surface roughness 106 of dielectric layer may typically be in a range above 100 nm after performing the desmear process. Surface roughness 106 may be defined as a deviation, i.e., an average distance in a vertical direction between apices of the peaks and troughs along a layer interface 108 extending in a horizontal direction. Failure to achieve sufficient adhesion between copper layer 102 and dielectric film 104 may result in delamination of the package substrate layers, and functional failure of the semiconductor package. Thus, the desmear process may be tuned to maximize surface roughness 106. For example, surface roughness 106 may be in a range of 200-400 nm. An increased surface roughness, however, is accompanied by functional tradeoffs.

As surface roughness 106 along layer interface 108 increases, copper layer 102 becomes more lossy. That is, the roughened surface creates transmission losses in conductors patterned in copper layer 102 when electrical signals are transmitted at higher frequencies. More particularly, the roughness at an edge of copper layer 102, e.g., along layer interface 108, may cause signal scattering within the conductors that results in electrical signal transmission losses. As processing advances allow the formation of thinner copper layers, a surface roughness 106 above 100 nm may become intolerable due to the concomitant signal losses. Accordingly, alternative means of adhering copper layer 102 to dielectric film 104 may be necessary.

In an aspect, a semiconductor package substrate includes an interfacial layer to adhere a metal layer to a dielectric layer. The interfacial layer may functionalize a surface of the dielectric layer, e.g., may aminate the surface. More particularly, interfacial layer compounds, such as amines or thiols, may attach to the dielectric layer at one end via, e.g., covalent bonds. The interfacial layer compounds may also attach to the metal layer at another end via, e.g., covalent and/or coordinate bonds. Thus, the interfacial layer, and processes of preparing the dielectric layer surface with the interfacial layer, promotes copper adhesion on a chemical level rather than a mechanical level. The surface preparation may be achieved using batch-processable wet chemical surface modification processes, which may be carried out in a simplified process requiring less manufacturing time and cost as compared to the relatively more complex desmear process. Furthermore, as described below, the chemical surface preparation promotes adhesion without increasing a roughness of the dielectric layer or the metal layer. Accordingly, sufficient adhesion between substrate layers may be achieved without degrading electrical signal transmission through conductors patterned in the metal layer.

Figure 2:
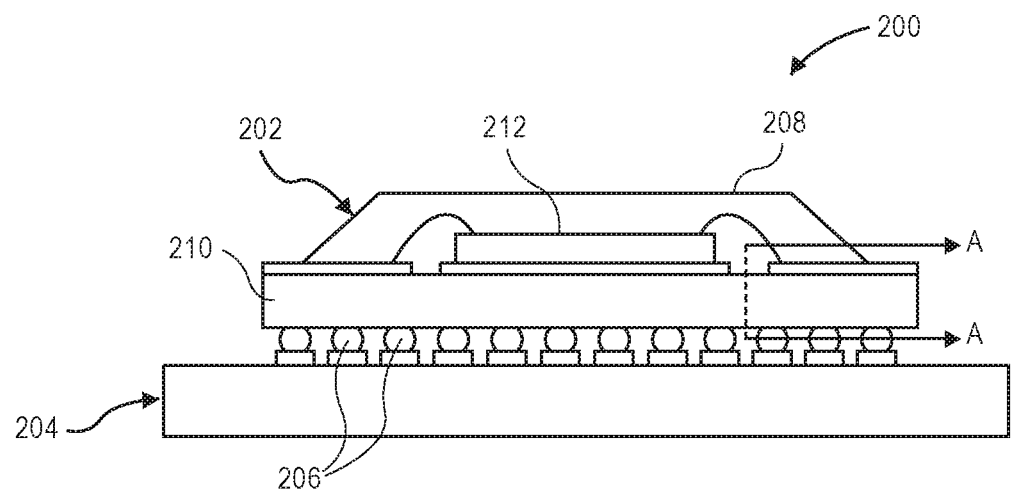
FIG. 2 illustrates a sectional view of a semiconductor package assembly, in accordance with an embodiment.

Referring to FIG. 2, a sectional view of a semiconductor package assembly is shown in accordance with an embodiment. Semiconductor package assembly 200 may include a semiconductor package 202 mounted on a circuit board 204, e.g., a motherboard or another printed circuit board of a computer. For example, semiconductor package 202 may include solder balls 206 attached to corresponding contacts on circuit board 204. Solder balls 206 may function as power/ground pins or as signal pins for I/O of semiconductor package 202.

In an embodiment, semiconductor package 202 includes a top package portion 208, e.g., a heat spreader, which forms a shell above a package substrate 210. More particularly, top package portion 208 may be overmolded on package substrate 210 to enclose an integrated circuit 212 of semiconductor package 202. Accordingly, package substrate 210 may act as an intermediate structure to mount integrated circuit 212 on circuit board 204 and to carry electrical signals between integrated circuit 212 and circuit board 204.

Figure 3:
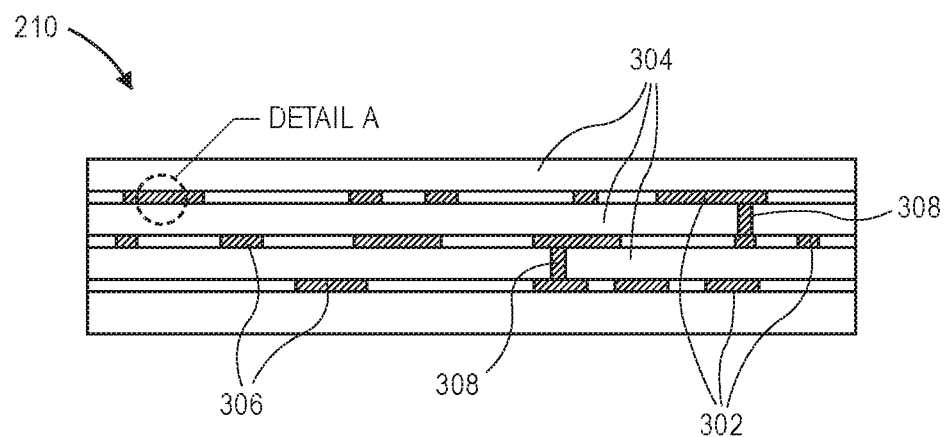
FIG. 3 illustrates a sectional view, taken about line A-A of FIG. 2, of a package substrate, in accordance with an embodiment.

Referring to FIG. 3, a sectional view, taken about line A-A of FIG. 2, of a package substrate is shown in accordance with an embodiment. Package substrate 210 of semiconductor package 202 may include several layers stacked on each other in a vertical direction. For example, package substrate 210 may include one or more metal layer 302 sandwiched between several dielectric layers 304. That is, a metal layer 302 having patterned conductors 306, e.g., conductive traces, may be laminated between an upper dielectric layer 304 and the lower dielectric layer 304. Conductors 306 may carry electrical signals transversely between the dielectric layers 304, e.g., in a horizontal direction perpendicular to the stacked direction. Similarly, package substrate 210 may include one or more via 308 extending vertically from an upper metal layer 302 to a lower metal layer 302 through an intervening dielectric layer 304. That is, vias 308 may carry electrical signals vertically between metal layers 302 in the stacked direction. Accordingly, integrated circuit 212 mounted on package substrate 210 may be electrically connected to one or more metal layers 302 in package substrate 210.

As described below, each dielectric layer 304 of package substrate 210 may be a portion of a dielectric film processed by a substrate lamination process. For example, a flat dielectric film may include an Ajinomoto Build-up Film (ABF) insulating film material. By way of example, a dielectric film may have width and height dimensions of, e.g., 340 mm by 510 mm, or 610 mm by 510 mm, and may have a thickness in a range of 2-100 microns, e.g., 60 microns. A copper material may be deposited on the dielectric film using an electroless copper and electrolytic deposition process to form metal layer 302. Subsequently, an additional dielectric film may be laminated over metal layer 302 to sandwich metal layer 302 between dielectric layers 304 of the stacked dielectric films. The dielectric film lamination and copper deposition processes may be repeated to fabricate a stack of films having a desired number of layers. The stack of films may be diced or segmented to produce several package substrates 210 having, e.g., 2-10 dielectric layers 304.

Figure 4:
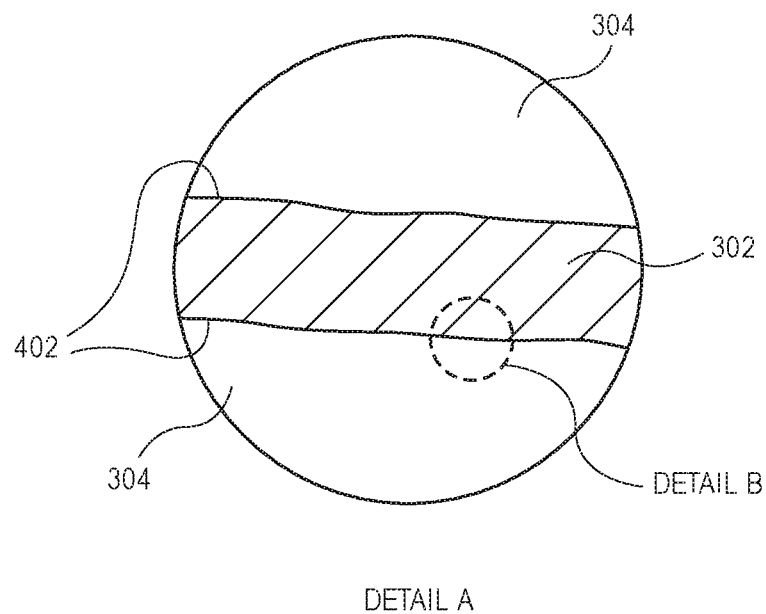
FIG. 4 illustrates a detail view, taken from Detail A of FIG. 3, of a metal layer between several dielectric layers of a package substrate, in accordance with an embodiment.

Referring to FIG. 4, a detail view, taken from Detail A of FIG. 3, of a metal layer between several dielectric layers of a package substrate is shown in accordance with an embodiment. Metal layer 302 of package substrate 210 may adhere to an upper dielectric layer 304 and a lower dielectric layer 304 at respective interface surfaces 402. More particularly, as described below, interface surfaces 402 may be functionalized to allow a material of metal layer 302, e.g., copper, to adhere to a relatively smooth surface of dielectric layer 304. Although the embodiments of package substrate 210 and methods used to fabricate package substrate 210 are described below as including functionalization of dielectric layer 304, it will be appreciated that metal layer 302 may also be functionalized, e.g., after being deposited on the lower dielectric layer 304, to promote adhesion of the upper dielectric layer 304 during a lamination process.

Figure 5:
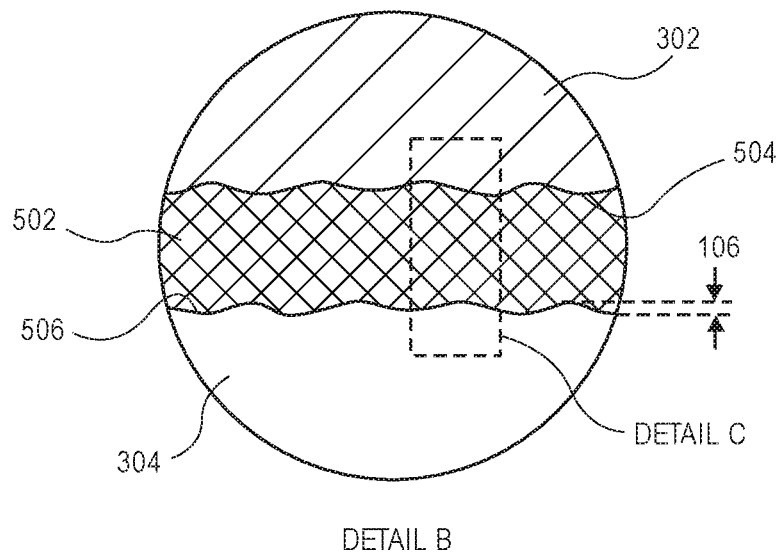
FIG. 5 illustrates a detail view, taken from Detail B of FIG. 4, of an interfacial layer between a metal layer and a dielectric layer of a package substrate, in accordance with an embodiment.

Referring to FIG. 5, a detail view, taken from Detail B of FIG. 4, of an interfacial layer between a metal layer and a dielectric layer of a package substrate is shown in accordance with an embodiment. Package substrate 210 may include an interfacial layer 502 between metal layer 302 and dielectric layer 304. For example, interfacial layer 502 may bond to a metallic interface surface 504 on metal layer 302 and to a dielectric interface surface 506 on dielectric layer 304. Thus, the respective interface surfaces 402 of metal layer 302 and dielectric layer 304 may be separated, albeit by a very small distance on the order of less than 1 nm, by one or more interfacial chemical compounds, as described below.

Interfacial layer 502 may be applied to dielectric interface surface 506 or to metallic interface surface 504 in a surface preparation process that does not roughen the target substrate. For example, interfacial layer 502 may be applied to dielectric interface surface 506 by dipping dielectric layer 304 in a solution having an interfacial layer compound. In contrast to the desmear process, which involves etching, the interfacial layer compound may not remove dielectric material at dielectric interface surface 506. Accordingly, surface roughness 106 of dielectric interface surface 506 may be less than a comparable surface roughness 106 of the above-described layer interface 108. For example, dielectric interface surface 506 may have surface roughness 106 in a range less than 100 nm. In an embodiment, surface roughness 106 may be less than 50 nm, e.g., 40-50 nm. Furthermore, interfacial layer 502 may have a uniform thickness such that a morphology of metallic interface surface 504 resembles a morphology of dielectric interface surface 506, and thus, metallic interface surface 504 may have a similar surface roughness as compared to dielectric interface surface 506. Thus, the surface roughness of metallic interface surface 504 may be in a range less than 100 nm, e.g., 40-50 nm, which is several times smoother than layer interface 108 formed by a conventional desmear process. Accordingly, transmission losses in conductors 306 of package substrate 210 having metal layer 302 adhered to dielectric layer 304 by interfacial layer 502 may be less than the transmission losses of package substrate 210 formed using the conventional desmear process.

Figure 6:
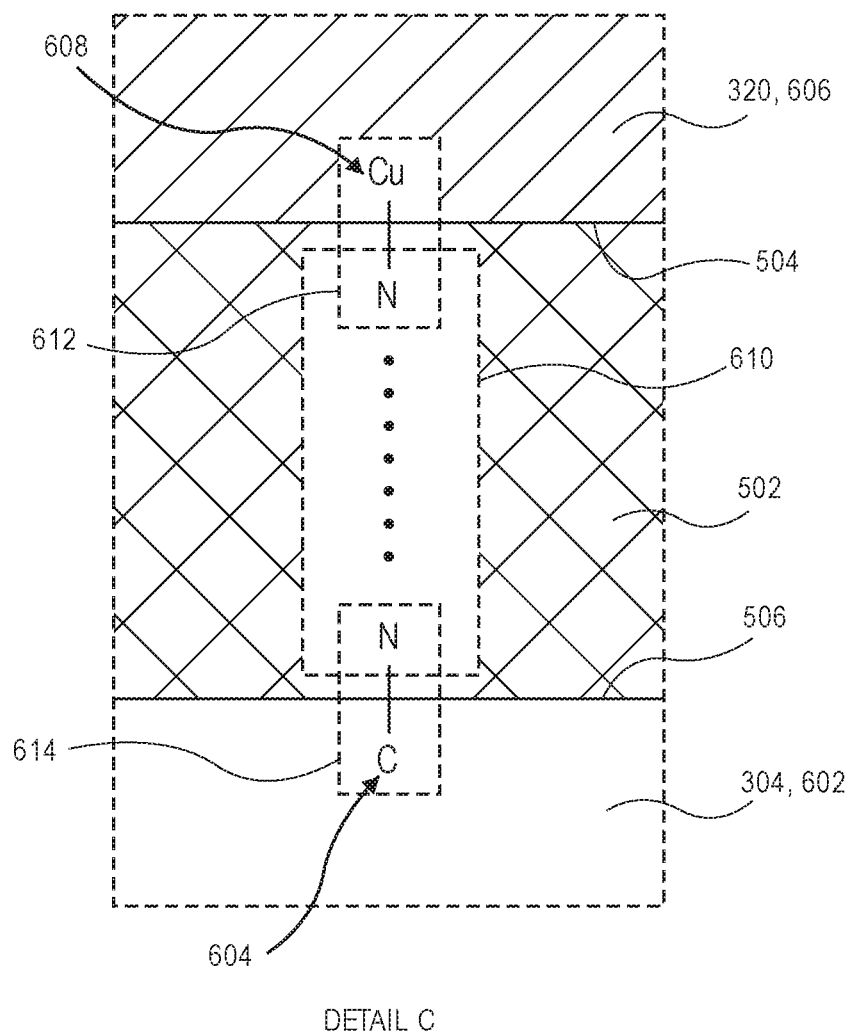
FIG. 6 illustrates a detail view, taken from Detail C of FIG. 5, and showing a schematic representation of an interfacial layer having an interfacial layer compound bound to a metal layer and a dielectric layer of a package substrate, in accordance with an embodiment.

Referring to FIG. 6, a detail view, taken from Detail C of FIG. 5, and showing a schematic representation of an interfacial layer having an interfacial layer compound bound to a metal layer and a dielectric layer of a package substrate is shown in accordance with an embodiment. Dielectric layer 304 of package substrate 210 may include an epoxy resin 602. Epoxy resin 602 may include an ABF material, or may include another polymer having electrically insulating properties. Accordingly, dielectric layer 304 may include a macromolecule having repeated subunits that include structured subunit atoms 604, e.g., carbon, hydrogen, or oxygen atoms, on dielectric interface surface 506. Metal layer 302 of package substrate 210 may include a metal deposition 606. Metal deposition 606 may include copper, or may include another metal having electrically conductive properties. Accordingly, metal layer 302 may include a metal ion 608 on metallic interface surface 504.

Interfacial layer 502 may include an interfacial layer compound 610 to form chemical bonds with subunit atom 604 and metal ion 608. For example, interfacial layer compound 610 may be an organic compound having elements available to form a chemical bond 612 or 614, e.g., a covalent bond and/or a coordinate bond, with the atoms or molecules in epoxy resin 602 or metal deposition 606. By way of example, interfacial layer compound 610 may include a chelator having a bonding atom, e.g., a nitrogen atom, available to form a coordinate bond 612 or a covalent bond 614 with metal ion 608. Accordingly, interfacial layer 502 may be attached to metal layer 302 by a coordinate bond 612 between the chelator and metal ion 608. Similarly, interfacial layer compound 610 may include a bonding atom, e.g., a nitrogen atom, available to form a covalent bonds 614 with subunit atom 604. Thus, interfacial layer 502 may be attached to dielectric layer 304 by covalent bonds 614. Accordingly, interfacial layer compound 610 facilitates a strong chemical adhesion between epoxy-based dielectric material of dielectric layer 304 and deposited copper of metal layer 302.

Interfacial layer compound 610 may include any chemical compound capable of forming a strong chemical bond with both dielectric layer 304 and metal layer 302. The strong chemical bond may be stronger than, e.g., an electrostatic interaction between interfacial layer compound 610 and either epoxy-based dielectric material of dielectric layer 304 or deposited copper of metal layer 302. Several examples of suitable interfacial layer compounds 610 are described below.

Figure 7A:
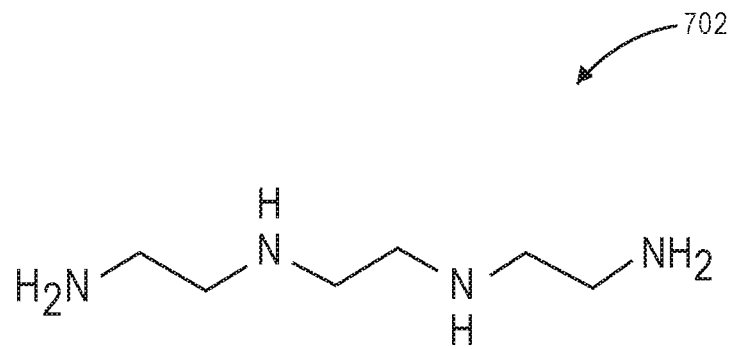
FIGS. 7A-7B illustrate structural formulas of various interfacial layer compounds, in accordance with an embodiment.

Referring to FIG. 7A, a structural formula of an interfacial layer compound is shown in accordance with an embodiment. Interfacial layer compound 610 may be a chelator that includes an amine 702. Amine-based functional groups chelate copper strongly due to a strong electron donating nature of nitrogen atoms with a free electron loan pair. By chemically bonding molecules that contain amines to a dielectric surface, a high density array of strong chemical bonds may be formed between interfacial layer 502 and dielectric layer 304.

In an embodiment, amine 702 is a polydentate amine, e.g., a triethylenetetramine (TETA) compound. TETA may be used as a hardening and crosslinking agent for epoxy resins. The structural formula of TETA is depicted in FIG. 7A, which shows that TETA includes two primary amines and two secondary amines, each of which are available to form covalent bonds 614 with subunit atoms 604 of dielectric layer 304. More particularly, TETA may form covalent bonds 614 with epoxy resin 602, and covalent bonds 614 may be a nitrogen-carbon bond. Accordingly, although the presence of interfacial layer 502 may not be optically identifiable, surface analysis of dielectric layer 304 by secondary ion mass spectroscopy (SIMS) or similar surface analysis may show an increased presence of nitrogen groups corresponding to interfacial layer 502, indicating that an amine-based surface preparation process was used in a method to fabricate package substrate 210.

In addition to forming covalent bonds 614 with dielectric layer 304, TETA may form coordinate bond 612 with metal layer 302. TETA serves as a reactive amine 702 to bond to surface resin of dielectric layer 304, several amine functionalities remain available to coordinate to copper of metal layer 302. The amine functionalities may bind strongly to the copper, or to other metal ions 608, e.g., to palladium ions present in an electroless copper deposition.

Sterics play a crucial role in determining a reaction rate of amines with epoxide groups of epoxy resin 602. Accordingly, primary amines are significantly more reactive than secondary amines. Thus, TETA may react with epoxide groups through a terminal primary amine. Accordingly, several amine functionalities may be present per reacted TETA molecule to coordinate to deposited copper. Chemical adhesion between dielectric layer 304 and metal layer 302 may be proportional to the number of amine-copper interactions per square unit of area, so the multi-functional nature of TETA may provide a density of surface amines several times higher than amination methodologies that produce only one amine per reactive site. Such methodologies include surface preparation with ammonia-based plasma, which installs only one functionality per reactive site.

Figure 7B:
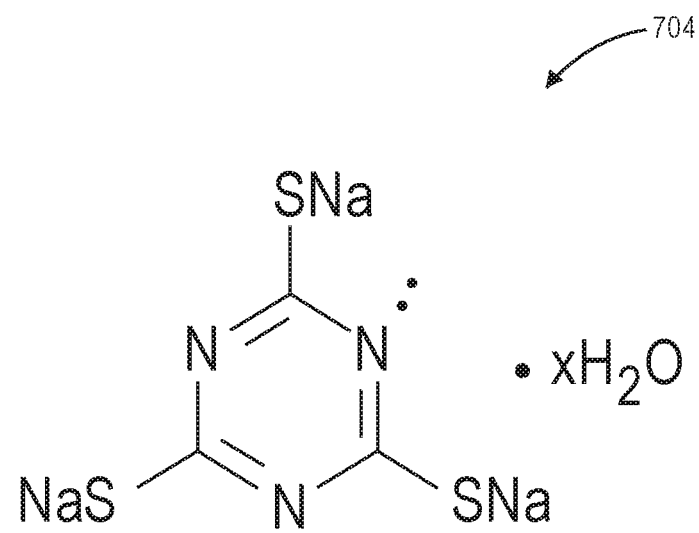

Referring to FIG. 7B, a structural formula of an interfacial layer compound is shown in accordance with an embodiment. Interfacial layer compound 610 may be a chelator that includes a thiol 704. Thiol functional groups chelate metal ions 608 and may also form covalently bound molecular monolayers on metallic surfaces. For example, thiols 704 may form self-assembled monolayers (SAMs) at metal surfaces by establishing strong covalent links to surface metal atoms to form a tight-packed two-dimensional network. The ability of thiols 704 to chelate metals is high, and highest for coinage metals, e.g., copper, silver, gold, palladium. Thus, interfacial layer 502 having a high density of free thiol groups may establish many covalent linkages at bond 612 to copper of metal layer 302. Additionally, thiols 704 may react and bond with epoxide groups that are present in unreacted epoxy-based polymers, e.g., uncured ABF films, at bond 614. Thiols 704 can be deprotonated into thiolates, which may undergo nucleophilic attack of epoxide groups to form covalent bonds 614 between sulfur and carbon atoms. For example, when interfacial layer compound 610 is a polydentate thiol molecule, one thiol group may react with epoxides and bond with a carbon atom at the dielectric interface surface 506 and another thiol group may be available to link to metal ion 608 or other metal atoms at metallic interface surface 504.

In an embodiment, thiol 704 is a trithiocyanuric acid trisodium salt (TCATS) compound. TCATS is a triazine-derived trithiolate having a decomposition temperature higher than 300 degrees Celsius. Notably, thiol groups deprotonated in the trisodium salt form, provide superior solubility due to negative charges and enhanced reactivity with surface epoxides. The structural formula of TCATS is depicted in FIG. 7B, which shows that TCATS is a polydentate thiol 704 including several sulfur atoms available to covalently bond with subunit atoms 604 of dielectric layer 304. More particularly, TCATS may form covalent bonds 614 with epoxy resin 602, and covalent bonds 614 may be a sulfur-carbon bond. Accordingly, although the presence of interfacial layer 502 may not be optically identifiable, surface analysis of dielectric layer 304 by secondary ion mass spectroscopy (SIMS) or similar analysis may show an increased presence of sulfur groups corresponding to interfacial layer 502, indicating that a thiol-based surface preparation process was used in a method to fabricate package substrate 210.

In addition to forming covalent bonds 614 with dielectric layer 304, TCATS may form bond 612 with metal layer 302. When TCATS reacts with epoxide groups of dielectric layer 304 to thiolate dielectric interface surface 506, several unbound thiol groups remain available to bond to copper of metal layer 302. The available thiol groups may bind strongly to the copper, or to other metal ions 608, e.g., to palladium ions present in an electroless copper deposition.

In an embodiment, interfacial layer compound 610 is native to dielectric layer 304. More particularly, a region of dielectric layer 304 extending to a depth below dielectric interface surface 506 may be treated to aminate dielectric interface surface 506. For example, dielectric interface surface 506 may be modified to facilitate chemical adhesion between an aromatic-based dielectric material and metal layer 302. The aromatic groups of the dielectric material may be aminated via a chemical process. For example, aromatic groups having carbon-hydrogen positions may undergo electrophilic aromatic substitution in a two-phase process to install amine groups at dielectric interface surface 506. The two-phase process is described further below, and may include a first phase during which the aromatic groups are chloroamidomethylated. The process may include a second phase during which the chloroamidomethylated aromatic groups are hydrolyzed to form an aminomethyl group having a primary amine group. The installed primary amine group may be free to bind to metal ions 608, e.g., copper or palladium ions, of metal layer 302 as described above.

Aromatic rings are known to be present in some formulations for buildup films, and are commonly found within epoxy, hardener, or additive agents. Moreover, dielectric materials can be formulated to include an even greater abundance of aromatic groups. Thus, aromatic groups may be present in a high density on dielectric interface surface 506. Accordingly, after treating dielectric layer 304 using the two-phase process described below, a portion of dielectric layer 304, e.g., a portion extending to a depth of less than 1 micron below an upper surface, may be transformed into interfacial layer 502. As such, interfacial layer 502 may include a high density of hydrolyzed chloromethylated aromatic groups having installed amine groups to form coordinate bond 612 with metal ion 608 of metal layer 302. As described above, although the presence of interfacial layer 502 may not be optically identifiable, surface analysis of dielectric layer 304 by secondary ion mass spectroscopy (SIMS) or similar analysis may show an increased presence of nitrogen groups corresponding to interfacial layer 502, indicating that an amine-based surface preparation process was used in a method to fabricate package substrate 210.

The above-described embodiments of package substrate 210 having interfacial layer 502 between metal layer 302 and dielectric layer 304 may be fabricated using a variety of methods. Several such methods are described below, and involve wet chemical surface modification of dielectric layer 304 to functionalize dielectric interface surface 506. The functionalized surface enhances adhesion between deposited copper and a dielectric film using chemical interactions rather than mechanical interactions. Although chemical interactions are energetically small, when present at sufficient density and integrated over a two-dimensional space, the chemical interactions represent substantial energetic contributions. Interfacial layer 502 formed by the following methods includes high densities of chelators to maximize this contribution through coordinate and/or covalent bonds with deposited copper.

It will be apparent to one skilled in the art that the following methods simplify dielectric surface preparation used in semiconductor package manufacturing as compared to current processes, e.g., the desmear process. More particularly, the process flows described below represent a reduction of equipment costs, tool time, technician time, and chemical costs, as compared to existing manufacturing methodologies.

Figure 8:
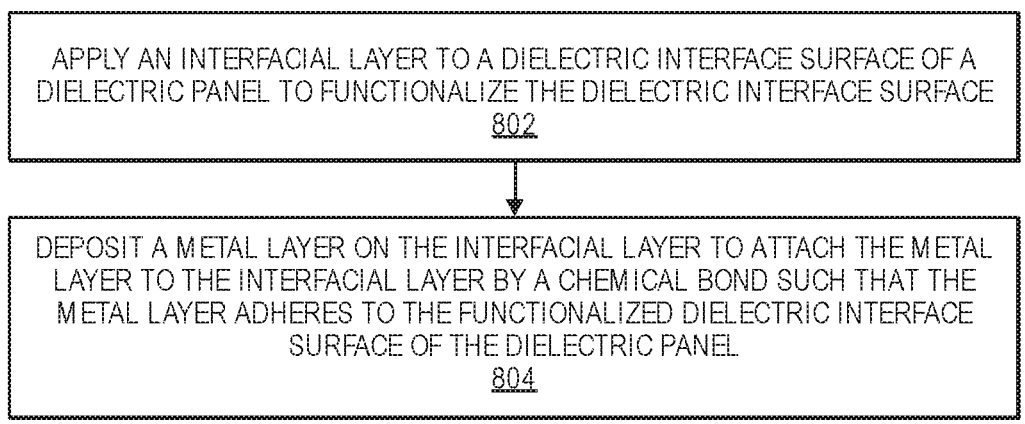
FIG. 8 illustrates a method of fabricating a package substrate having an interfacial layer between a metal layer and a dielectric layer, in accordance with an embodiment.
Figure 9:
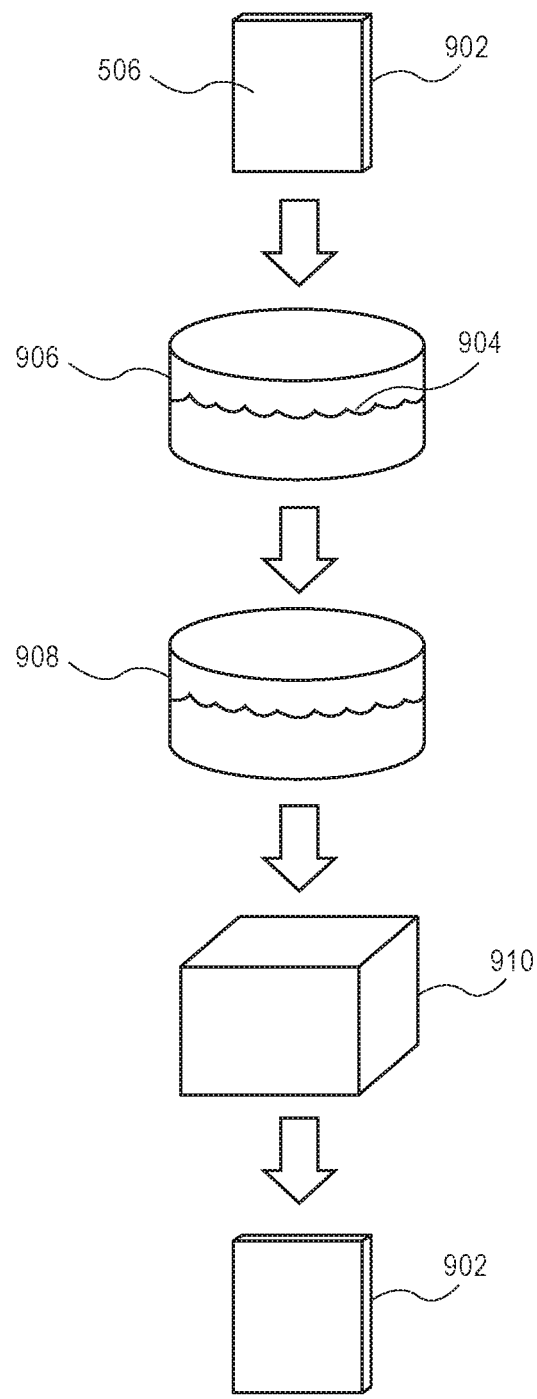
FIG. 9 illustrates operations of a method of fabricating a package substrate having an interfacial layer between a metal layer and a dielectric layer, in accordance with an embodiment.

Referring to FIG. 8, a method of fabricating a package substrate having an interfacial layer between a metal layer and a dielectric layer is shown in accordance with an embodiment. The method may be performed according to the operations illustrated in FIG. 9. Accordingly, a description of the method is provided below with alternating reference to FIGS. 8 and 9.

Referring to FIG. 8, at operation 802, interfacial layer 502 may be applied to dielectric interface surface 506. For example, referring to FIG. 9, dielectric interface surface 506 may be an exposed surface of a dielectric film 902. In an embodiment, dielectric film 902 includes an uncured dielectric material. For example, dielectric film 902 may be an ABF dielectric film that has not been fully cured. Accordingly, since curing dielectric film 902 eliminates epoxide groups on dielectric interface surface 506 via reactions with hardening agents, dielectric film 902 may have a higher density of epoxide groups as compared to a fully-cured dielectric film 902. More particularly, at least 50% of the epoxide groups present in a completely uncured dielectric film 902 may be present in the partly uncured dielectric film 902 during application of interfacial layer 502. This may be compared, for example, to a presence of less than 5% of the epoxide groups present in a completely uncured dielectric film 902 when the dielectric film 902 is fully cured.

A degree of functionalization of dielectric interface surface 506 may depend on a presence of surface epoxides, and thus, interfacial layer 502 may be applied to dielectric interface surface 506 when dielectric film 902 is partly uncured. One skilled in the art will recognize that, in an embodiment, dielectric film 902 may be tailored to achieve a desired ratio of unreacted epoxy groups post-curing. The application of interfacial layer 502 may include dipping dielectric film 902 in a first solution 904 containing an amine 702. More particularly, a first bath 906 within which dielectric film 902 is immersed may contain an amine 702 solution having 5 wt. % aqueous TETA. In an embodiment, the amine bath may have a temperature of 50-100° C., e.g., 80° C. Dielectric film 902 may remain immersed within the amine bath for several minutes, e.g., 10 minutes, to several hours, e.g., 2 hours or more. Accordingly, the amine bath may aminate dielectric interface surface 506 by linking TETA interfacial layer compound 610 to surface epoxides on dielectric interface surface 506. More particularly, functionalizing dielectric interface surface 506 may include forming covalent bonds 614 between interfacial layer compounds 610 in the amine bath and subunit atoms 604 of the epoxide groups on dielectric interface surface 506 of dielectric layer 304.

In an embodiment, the application of interfacial layer 502 includes dipping dielectric film 902 in a first solution 904 containing a thiol 704. More particularly, first bath 906 within which dielectric film 902 is immersed may contain a thiol solution having 1% wt. aqueous TCATS. In an embodiment, the thiol bath may have a temperature of 50-90° C., e.g., 70° C. Dielectric film 902 may remain immersed within the thiol bath for several hours, e.g., 5 hours. The aqueous solution may be stirred during surface thiolation of dielectric film 902. Accordingly, the thiol bath may thiolate dielectric interface surface 506 by thiolating surface epoxides on dielectric interface surface 506. More particularly, functionalizing dielectric interface surface 506 may include forming covalent bonds 614 between interfacial layer compounds 610 in the thiol bath and subunit atoms 604 of the epoxide groups on dielectric interface surface 506 of dielectric layer 304.

Thiolation in the thiol bath may generate a high density of covalent linkages, i.e., sulfur-carbon bonds, between interfacial layer 502 and dielectric layer 304. Furthermore, the reaction mechanism may be influenced by the presence of a thiol hydrogen, and thus, a pH level of the aqueous first solution 904 may be modified accordingly. For example, the pH may be raised to increase the density of covalent linkages. More particularly, raising pH may provide basic conditions to keep the SH thiol group deprotonated (S—), which may increase its reactivity with both metal and epoxide.

After removing dielectric film 902 from first bath 906, one or more rinse operations may be performed to remove unreacted interfacial layer compounds 610 from dielectric interface surface 506. For example, dielectric film 902 may be immersed in a rinse bath 908 containing water for several minutes, e.g., 5 minutes. The water in the rinse bath 908 may be agitated using stirring or ultrasonication techniques.

Dielectric film 902 may be removed from the rinse bath 908 and subjected to one or more drying operations to remove residual water content. For example, the rinsed dielectric film 902 having a functionalized surface may be placed in an oven 910 to dry the residual water. Drying may be performed at a temperature of 100 degrees Celsius for 30 minutes to bake out the residual water moisture from the dielectric material.

Heating dielectric film 902 in oven 910 may serve as both a drying and a curing operation. For example, after applying interfacial layer 502 to dielectric interface surface 506, dielectric film 902 may be partly cured. The application of heat in oven 910 may perform some additional curing, e.g., dielectric film 902 may be partly cured or fully cured after processing by oven 910. Additionally, further curing operations may be performed after dielectric film 902 is heated by oven 910 to fully cure dielectric film 902.

At operation 804, dielectric film 902 having a functionalized dielectric interface surface 506 may be subjected to a metal coating operation. More particularly, metal layer 302 may be deposited on interfacial layer 502 to attach metal layer 302 to interfacial layer 502 by a coordinate bond and/or covalent bond 612. The metal coating operation may be a copper deposition process, e.g., an electroless copper and electrolytic deposition process. For example, a conducting seed layer may be formed by electroless copper and electrolytic copper may be deposited on the seed layer. Thus, metal ions 608 of metal layer 302 may bond to interfacial layer compound 610 such that metal layer 302 adheres to the functionalized dielectric interface surface 506 of dielectric film 902.

When metal layer 302 is adhered to dielectric interface surface 506, additional semiconductor processing operations may be performed. For example, a semi-additive process may be used to form circuitry, e.g., conductors 306, in metal layer 302. Similarly, a via formation process may be employed using, e.g., a laser, to form vias 308 through metal layer 302 and/or dielectric film 902.

In an embodiment, a second dielectric film may be laminated over the deposited metal layer 302 to form an upper dielectric layer 304 of package substrate 210. The second dielectric film may include a preformed film, or in an embodiment, the second dielectric film may include a liquid coating that is dried and partially cured to form a dielectric film on metal layer 302. Metal layer 302 may be roughened prior to applying the second dielectric film. Alternatively, metal layer 302 may be functionalized using interfacial layer compound 610 such that the second dielectric film adheres to metal layer 302 via a second interfacial layer. After forming the second dielectric film over metal layer 302, additional wet chemical processing such as that described above may be applied to functionalize the second dielectric film and deposit a second metal layer. More particularly, the process described above may be repeated to produce a desired number of layers in package substrate 210.

Figure 10:
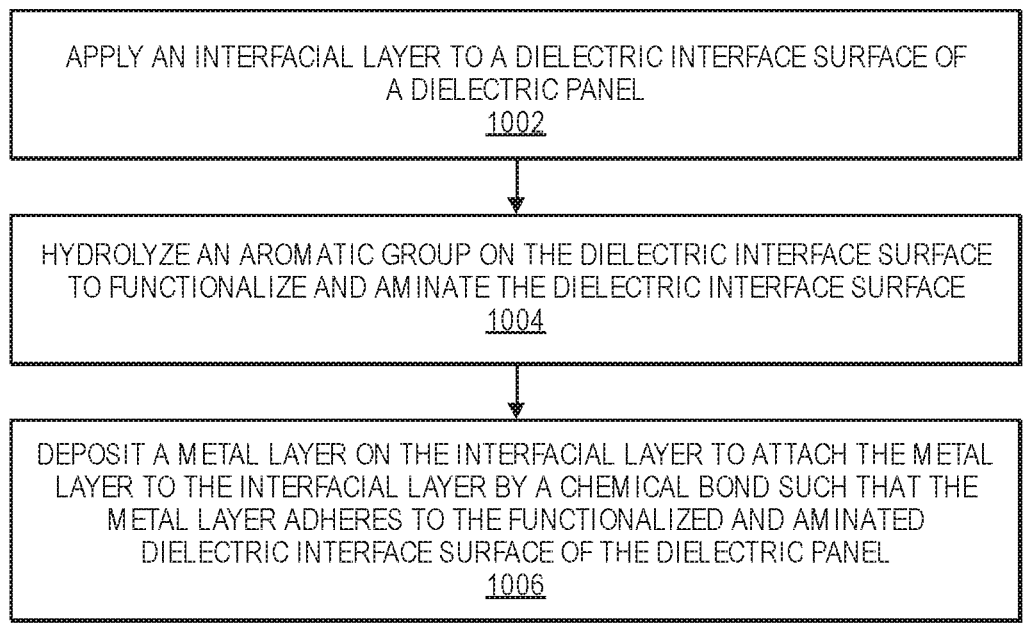
FIG. 10 illustrates a method of fabricating a package substrate having an interfacial layer between a metal layer and a dielectric layer, in accordance with an embodiment.
Figure 11:
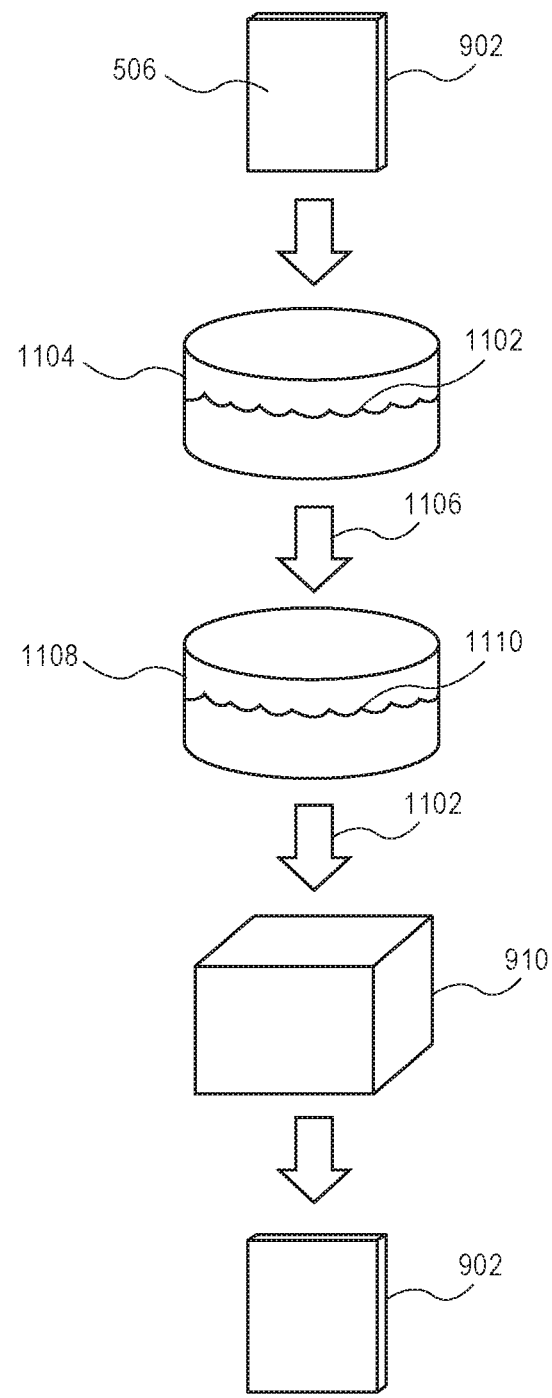
FIG. 11 illustrates operations of a method of fabricating a package substrate having an interfacial layer between a metal layer and a dielectric layer, in accordance with an embodiment.

Referring to FIG. 10, a method of fabricating a package substrate having an interfacial layer between a metal layer and a dielectric layer is shown in accordance with an embodiment. The method may be performed according to the operations illustrated in FIG. 11. Accordingly, a description of the method is provided below with alternating reference to FIGS. 10 and 11.

Referring to FIG. 10, at operation 1002, interfacial layer 502 may be applied to dielectric interface surface 506. Dielectric interface surface 506 may be an exposed surface of a dielectric film 902. Dielectric film 902 may be formed from a material having a density of aromatic groups available at the exposed surface to support functionalization of dielectric interface surface 506 via wet chemical amination through electrophilic aromatic substitution. For example, dielectric film 902 may include an uncured dielectric material. A relatively high density of aromatic groups may be found in typical dielectric substrate materials, and thus, surface amination of dielectric interface surface 506 may generate a higher density of covalent bonds 614 between interfacial layer 502 and dielectric layer 304 as compared to the surface amination and surface thiolation processes described above.

In an embodiment, functionalization of dielectric interface surface 506 may include functionalization of an aromatic-based polymer with amine groups using a two-phase process of chloroamidomethylation followed by acid hydrolysis to produce aminomethylated film samples. In a first phase, application of interfacial layer 502 may include dipping dielectric film 902 in a first solution 1102 containing n-methylol-2-chloracetamide (NMCA) compounds. More particularly, a first bath 1104 within which dielectric film 902 is immersed may contain first solution 1102 having 0.93 M NMCA in 1:1 wt. $H_2SO_4$/1-nitropropane, RT 4h. Accordingly, the first solution 1102 may install NMCA compounds on aromatic groups at dielectric interface surface 506 of dielectric film 902. Thus, applying interfacial layer 502 may include a first phase of chloroamidomethylating aromatic groups on dielectric interface surface 506.

Dielectric film 902 may be removed from first bath 1104 and subjected to a rinsing operation 1106. In an embodiment, rinsing operation 1106 includes applying a rinsing solution having 1:1 MeOH, $H_2O$ to remove excess NMCA from dielectric interface surface 506.

Functionalization of dielectric interface surface 506 may include a second phase. For example, at operation 1004, the second phase may include hydrolyzing aromatic groups on dielectric interface surface 506 after the aromatic groups are chloroamidomethylated. Hydrolyzing the aromatic groups may include dipping dielectric film 902 in a second bath 1108 having a second solution 1110. More particularly, the second solution 1110 may include an acid hydrolysis solution containing 1:1 vol. % EtOH and 37% HCl. Dielectric film 902 may remain immersed in the second solution 1110 for 1-2 hours, e.g., 90 minutes. Acid hydrolysis may facilitate nitrogen-carbon bond cleavage of the chloramidomethylated aromatic groups, leaving aminomethyl groups on dielectric interface surface 506. More particularly, hydrolyzing the aromatic groups may remove —$CH_2Cl$ groups and leave —$CH_2NH_2$ groups on dielectric interface surface 506. Accordingly, dielectric interface surface 506 may be aminated such that carbon-nitrogen groups are attached to aromatic rings of dielectric layer 304. The remaining aminomethyl groups may include a primary amine granting superior steric availability for coordinating to metal layer 302, e.g., copper. Furthermore, the extended length of a methylene group in interfacial layer 502 may contribute to this steric factor.

Dielectric film 902 may be removed from second bath 1108 and subjected to another rinsing operation 1106. In an embodiment, rinsing operation 1106 includes applying water to dielectric film 902 to remove excess HCl residue.

After rinsing operation 1106, dielectric film 902 may be subjected to one or more drying operations to remove residual water content. For example, the rinsed dielectric film 902 having a functionalized surface may be placed in an oven 910 to dry the residual water. Drying may be performed at a temperature of 70-120° C., e.g., 100° C. for 30 minutes to bake out the residual water moisture from the dielectric material.

Heating dielectric film 902 in oven 910 may serve as both a drying and a curing operation. For example, after applying interfacial layer 502 to dielectric interface surface 506, dielectric film 902 may be partly cured. The application of heat in oven 910 may perform some curing, e.g., dielectric film 902 may be partly cured or fully cured after processing by oven 910. Additionally, further curing operations may be performed after dielectric film 902 is heated by oven 910 to fully cure dielectric film 902.

At operation 1006, dielectric film 902 having a functionalized dielectric interface surface 506 may be subjected to a metal coating operation. More particularly, metal layer 302 may be deposited on interfacial layer 502 to attach metal layer 302 to interfacial layer 502 by a coordinate bond and/or a covalent bond 612. The metal coating operation may be a copper deposition process, e.g., an electrolytic or an electroless copper deposition process. Thus, metal ions 608 and/or metal atoms of metal layer 302 may bond to interfacial layer compound 610 such that metal layer 302 adheres to the functionalized and aminated dielectric interface surface 506 of dielectric film 902.

As described above, additional semiconductor processing operations may be performed, e.g., a semi-additive process to form circuitry, e.g., conductors 306, or a via formation process to form vias 308 through metal layer 302 and/or dielectric film 902. Furthermore, a second dielectric film may be laminated over the deposited metal layer 302 to form an upper dielectric layer 304 of package substrate 210. The process described above may be repeated to produce a desired number of layers in package substrate 210.

Figure 12:
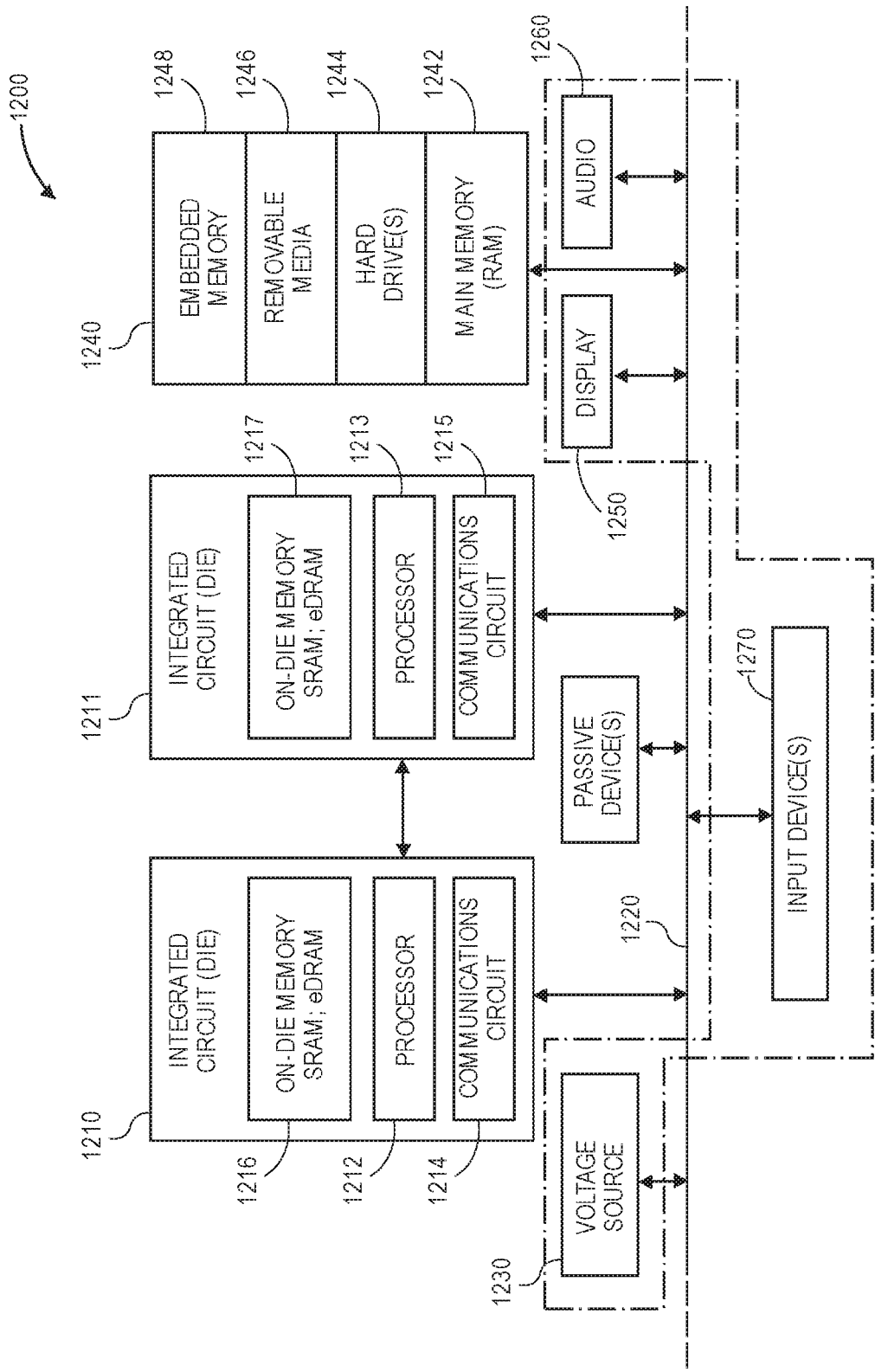
FIG. 12 is a schematic of a computer system, in accordance with an embodiment.

FIG. 12 is a schematic of a computer system, in accordance with an embodiment. The computer system 1200 (also referred to as the electronic system 1200) as depicted can embody a semiconductor package substrate including an interfacial layer between a metal layer and a dielectric layer, according to any of the several disclosed embodiments and their equivalents as set forth in this disclosure. The computer system 1200 may be a mobile device such as a netbook computer. The computer system 1200 may be a mobile device such as a wireless smart phone. The computer system 1200 may be a desktop computer. The computer system 1200 may be a hand-held reader. The computer system 1200 may be a server system. The computer system 1200 may be a supercomputer or high-performance computing system.

In an embodiment, the electronic system 1200 is a computer system that includes a system bus 1220 to electrically couple the various components of the electronic system 1200. The system bus 1220 is a single bus or any combination of busses according to various embodiments. The electronic system 1200 includes a voltage source 1230 that provides power to the integrated circuit 1210. In some embodiments, the voltage source 1230 supplies current to the integrated circuit 1210 through the system bus 1220.

The integrated circuit 1210 is electrically coupled to the system bus 1220 and includes any circuit, or combination of circuits, according to an embodiment. In an embodiment, the integrated circuit 1210 includes a processor 1212 that can be of any type. As used herein, the processor 1212 may mean any type of circuit such as, but not limited to, a microprocessor, a microcontroller, a graphics processor, a digital signal processor, or another processor. In an embodiment, the processor 1212 includes, or is coupled with, a semiconductor package substrate including an interfacial layer between a metal layer and a dielectric layer, as disclosed herein. In an embodiment, SRAM embodiments are found in memory caches of the processor. Other types of circuits that can be included in the integrated circuit 1210 are a custom circuit or an application-specific integrated circuit (ASIC), such as a communications circuit 1214 for use in wireless devices such as cellular telephones, smart phones, pagers, portable computers, two-way radios, and similar electronic systems, or a communications circuit for servers. In an embodiment, the integrated circuit 1210 includes on-die memory 1216 such as static random-access memory (SRAM). In an embodiment, the integrated circuit 1210 includes embedded on-die memory 1216 such as embedded dynamic random-access memory (eDRAM).

In an embodiment, the integrated circuit 1210 is complemented with a subsequent integrated circuit 1211. Useful embodiments include a dual processor 1213 and a dual communications circuit 1215 and dual on-die memory 1217 such as SRAM. In an embodiment, the dual integrated circuit 1211 includes embedded on-die memory 1217 such as eDRAM.

In an embodiment, the electronic system 1200 also includes an external memory 1240 that in turn may include one or more memory elements suitable to the particular application, such as a main memory 1242 in the form of RAM, one or more hard drives 1244, and/or one or more drives that handle removable media 1246, such as diskettes, compact disks (CDs), digital variable disks (DVDs), flash memory drives, and other removable media known in the art. The external memory 1240 may also be embedded memory 1248 such as a first die in a die stack, according to an embodiment.

In an embodiment, the electronic system 1200 also includes a display device 1250, and an audio output 1260. In an embodiment, the electronic system 1200 includes an input device such as a controller 1270 that may be a keyboard, mouse, trackball, game controller, microphone, voice-recognition device, or any other input device that inputs information into the electronic system 1200. In an embodiment, an input device 1270 is a camera. In an embodiment, an input device 1270 is a digital sound recorder. In an embodiment, an input device 1270 is a camera and a digital sound recorder.

As shown herein, the integrated circuit 1210 can be implemented in a number of different embodiments including a semiconductor package substrate including an interfacial layer between a metal layer and a dielectric layer, according to any of the several disclosed embodiments and their equivalents, an electronic system, a computer system, one or more methods of fabricating an integrated circuit, and one or more methods of fabricating an electronic assembly that includes a semiconductor package substrate having an interfacial layer between a metal layer and a dielectric layer, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor package substrates having an interfacial layer between a metal layer and a dielectric layer embodiments and their equivalents. A foundation substrate may be included, as represented by the dashed line of FIG. 12. Passive devices may also be included, as is also depicted in FIG. 12.

Embodiments of semiconductor package substrates and methods of forming semiconductor package substrates are described. In an embodiment, a semiconductor package substrate includes a metal layer having a metallic interface surface, and a dielectric layer having a dielectric interface surface. The semiconductor package substrate includes an interfacial layer between the metal layer and the dielectric layer. The interfacial layer is attached to the metal layer by a chemical bond.

In one embodiment, the dielectric interface surface includes a surface roughness in a range less than 100 nm.

In one embodiment, the metal layer includes a metal deposition having a metal ion on the metallic interface surface. The dielectric layer includes an epoxy resin.

In one embodiment, the interfacial layer includes an interfacial layer compound selected from a group consisting of an amine and a thiol. The chemical bond includes one or more of a coordinate bond or a covalent bond between the interfacial layer compound and the metal ion.

In one embodiment, the interfacial layer is attached to the dielectric layer by a second covalent bond.

In one embodiment, the amine is a triethylenetetramine (TETA) compound. The second covalent bond is a nitrogen-carbon bond.

In one embodiment, the thiol is a trithiocyanuric acid trisodium salt (TCATS) compound. The second covalent bond is a sulfur-carbon bond.

In one embodiment, the interfacial layer includes a hydrolyzed chloromethylated aromatic group.

In an embodiment, a semiconductor package includes a package substrate including a metal layer having a metallic interface surface, a dielectric layer having a dielectric interface surface, and an interfacial layer between the metal layer and the dielectric layer. The interfacial layer is attached to the metal layer by a chemical bond. The semiconductor package includes an integrated circuit mounted on the package substrate and electrically connected to the metal layer.

In one embodiment, the dielectric interface surface includes a surface roughness in a range less than 100 nm.

In one embodiment, the metal layer includes a metal deposition having a metal ion on the metallic interface surface. The dielectric layer includes an epoxy resin.

In one embodiment, the interfacial layer includes an interfacial layer compound selected from a group consisting of an amine and a thiol. The chemical bond includes one or more of a coordinate bond or a covalent bond between the interfacial layer compound and the metal ion.

In one embodiment, the interfacial layer includes a hydrolyzed chloromethylated aromatic group.

In an embodiment, a method of fabricating a semiconductor package substrate having an interfacial layer between a metal layer and a dielectric layer includes applying an interfacial layer to a dielectric interface surface of a dielectric film to functionalize the dielectric interface surface. The method includes depositing a metal layer on the interfacial layer to attach the metal layer to the interfacial layer by a chemical bond such that the metal layer adheres to the functionalized dielectric interface surface of the dielectric film.

In one embodiment, the dielectric film is partly uncured when the interfacial layer is applied to the dielectric interface surface.

In one embodiment, functionalizing the dielectric interface surface includes forming covalent bonds between the interfacial layer and the dielectric interface surface.

In one embodiment, applying the interfacial layer includes dipping the dielectric film in a solution containing an amine to aminate the dielectric interface surface.

In one embodiment, applying the interfacial layer includes dipping the dielectric film in a solution containing a thiol to thiolate the dielectric interface surface.

In one embodiment, the method includes hydrolyzing an aromatic group on the dielectric interface surface to aminate the dielectric interface surface.

In one embodiment, applying the interfacial layer includes dipping the dielectric film in a solution containing n-methylol-2-chloroacetamide to chloroamidomethylate the aromatic group. Furthermore, hydrolyzing the aromatic group includes acid hydrolyzing the chloroamidomethylated aromatic group.

What is claimed is:

1. A semiconductor package substrate, comprising:
   a metal layer including a patterned conductor having a metallic interface surface, wherein the metallic interface surface includes a metal ion;
   a dielectric layer including an epoxy resin having a dielectric interface surface; and
   an interfacial layer between the metal layer and the dielectric layer, wherein the interfacial layer includes an interfacial layer compound having an end chemically bound to the metal ion of the patterned conductor of the metal layer.

2. The semiconductor package substrate of claim 1, wherein the dielectric interface surface includes a surface roughness in a range less than 100 nm.

3. The semiconductor package substrate of claim 2, wherein the metal layer includes a metal deposition having the metal ion on the metallic interface surface.

4. The semiconductor package substrate of claim 3, wherein the interfacial layer compound is selected from a group consisting of an amine and a thiol, and wherein the end of the interfacial layer compound is chemically bound to the metal ion by one or more of a coordinate bond or a covalent bond.

5. The semiconductor package substrate of claim 4, wherein the interfacial layer compound has a second end chemically bound to the dielectric layer by a second covalent bond.

6. The semiconductor package substrate of claim 5, wherein the amine is a triethylenetetramine (TETA) compound, and wherein the second covalent bond is a nitrogen-carbon bond.

7. The semiconductor package substrate of claim 5, wherein the thiol is a trithiocyanuric acid trisodium salt (TCATS) compound, and wherein the second covalent bond is a sulfur-carbon bond.

8. The semiconductor package substrate of claim 4, wherein the interfacial layer includes a hydrolyzed chloromethylated aromatic group.

9. A semiconductor package, comprising:
a package substrate including:
a metal layer including a patterned conductor having a metallic interface surface, wherein the metallic interface surface includes a metal ion,
a dielectric layer including an epoxy resin having a dielectric interface surface, and
an interfacial layer between the metal layer and the dielectric layer, wherein the interfacial layer includes an interfacial layer compound having an end chemically bound to the metal ion of the patterned conductor of the metal layer; and
an integrated circuit mounted on the package substrate and electrically connected to the patterned conductor of the metal layer.

10. The semiconductor package of claim 9, wherein the dielectric interface surface includes a surface roughness in a range less than 100 nm.

11. The semiconductor package of claim 10, wherein the metal layer includes a metal deposition having the metal ion on the metallic interface surface.

12. The semiconductor package of claim 11, wherein the interfacial layer compound is selected from a group consisting of an amine and a thiol, and wherein the end of the interfacial layer compound is chemically bound to the metal ion by one or more of a coordinate bond or a covalent bond.

13. The semiconductor package of claim 12, wherein the interfacial layer includes a hydrolyzed chloromethylated aromatic group.

14. A method, comprising:
applying an interfacial layer to a dielectric interface surface of an epoxy resin of a dielectric film to functionalize the dielectric interface surface, wherein the interfacial layer includes an interfacial layer compound having an end; and
depositing a metal layer including a patterned conductor having a metallic interface surface on the interfacial layer to chemically bond a metal ion of the metallic interface surface to the end of the interfacial layer compound of the interfacial layer such that the metal layer adheres to the functionalized dielectric interface surface of the dielectric film.

15. The method of claim 14, wherein the dielectric film is partly uncured when the interfacial layer is applied to the dielectric interface surface.

16. The method of claim 15, wherein functionalizing the dielectric interface surface includes forming covalent bonds between the interfacial layer and the dielectric interface surface.

17. The method of claim 16, wherein applying the interfacial layer includes dipping the dielectric film in a solution containing an amine to aminate the dielectric interface surface.

18. The method of claim 16, wherein applying the interfacial layer includes dipping the dielectric film in a solution containing a thiol to thiolate the dielectric interface surface.

19. The method of claim 14 further comprising hydrolyzing an aromatic group on the dielectric interface surface to aminate the dielectric interface surface.

20. The method of claim 19, wherein applying the interfacial layer includes dipping the dielectric film in a solution containing n-methylol-2-chloroacetamide to chloroamidomethylate the aromatic group, and wherein hydrolyzing the aromatic group includes acid hydrolyzing the chloroamidomethylated aromatic group.

* * * * *